(12) United States Patent
Hornung

(10) Patent No.: US 9,880,326 B2
(45) Date of Patent: Jan. 30, 2018

(54) SURFACE STRUCTURE AND FRESNEL LENS AND TOOL FOR PRODUCTION OF A SURFACE STRUCTURE

(75) Inventor: Thorsten Hornung, Freiburg (DE)

(73) Assignee: Fraunhofer-Gesellschaft zur Foederung der angewandten Forschung e.V., Munich (DE)

( * ) Notice: Subject to any disclaimer, the term of this patent is extended or adjusted under 35 U.S.C. 154(b) by 248 days.

(21) Appl. No.: 13/207,472

(22) Filed: Aug. 11, 2011

(65) Prior Publication Data

US 2012/0067418 A1 Mar. 22, 2012

(30) Foreign Application Priority Data

Aug. 11, 2010 (DE) .................. 10 2010 034 020

(51) Int. Cl.
| | |
|---|---|
| G02B 3/08 | (2006.01) |
| B29D 11/00 | (2006.01) |
| F24J 2/08 | (2006.01) |
| H01L 31/054 | (2014.01) |
| G02B 5/02 | (2006.01) |
| B29L 11/00 | (2006.01) |

(52) U.S. Cl.
CPC .......... *G02B 3/08* (2013.01); *B29D 11/00269* (2013.01); *F24J 2/085* (2013.01); *H01L 31/0543* (2014.12); *B29L 2011/005* (2013.01); *G02B 5/0278* (2013.01); *Y02E 10/43* (2013.01); *Y02E 10/52* (2013.01); *Y10T 428/24479* (2015.01)

(58) Field of Classification Search
CPC .......... H01L 31/0522; H01L 31/0524

USPC .......................... 359/742; 362/521
See application file for complete search history.

(56) References Cited

U.S. PATENT DOCUMENTS

| | | | | |
|---|---|---|---|---|
| 3,982,822 A | * | 9/1976 | Conder et al. ............. | 359/742 |
| 4,170,616 A | * | 10/1979 | Jebens ............... | B29C 39/026 |
| | | | | 264/1.7 |
| 4,755,921 A | * | 7/1988 | Nelson ................. | F21V 5/00 |
| | | | | 126/698 |
| 5,260,828 A | * | 11/1993 | Londono ............ | G02B 5/1876 |
| | | | | 359/565 |
| 5,296,724 A | * | 3/1994 | Ogata ................ | G02B 6/4204 |
| | | | | 257/680 |

(Continued)

FOREIGN PATENT DOCUMENTS

| | | |
|---|---|---|
| DE | 29 20 630 A1 | 12/1979 |
| GB | 2021807 A | 12/1979 |

(Continued)

OTHER PUBLICATIONS

A. Fluegel, "Thermal expansion measurement of glasses", 2005 [retrieved from internet at http://glassproperties.com/expansion/ExpansionMeasurement.htm on Sep. 14, 2013].*

(Continued)

*Primary Examiner* — Eric R Smith

(74) *Attorney, Agent, or Firm* — Marshall & Melhorn, LLC

(57) ABSTRACT

The invention relates to a surface structure and a Fresnel lens which has at least one such surface structure. Furthermore, the invention relates to a tool for production of a surface structure and a method for production of a surface structure or Fresnel lens. Furthermore, the invention relates to the use of a Fresnel lens.

13 Claims, 5 Drawing Sheets

(56) References Cited

U.S. PATENT DOCUMENTS

| | | | |
|---|---|---|---|
| 5,727,585 A * | 3/1998 | Daume et al. | 136/246 |
| 5,806,955 A | 9/1998 | Parkyn et al. | |
| 5,977,478 A | 11/1999 | Hibino et al. | |
| 6,399,874 B1 * | 6/2002 | Olah | 136/259 |
| 6,590,709 B1 | 7/2003 | Ori et al. | |
| 6,724,535 B1 * | 4/2004 | Clabburn | 359/619 |
| 7,529,048 B2 * | 5/2009 | Lin | 359/831 |
| 7,530,719 B2 * | 5/2009 | Yamashita et al. | 362/600 |
| 7,535,637 B2 * | 5/2009 | Ogawa et al. | 359/457 |
| 2004/0169921 A1 * | 9/2004 | Suzuki et al. | 359/457 |
| 2005/0041307 A1 * | 2/2005 | Barone | G02B 3/08 359/742 |
| 2008/0271776 A1 * | 11/2008 | Morgan | 136/246 |
| 2009/0250095 A1 * | 10/2009 | Thorley et al. | 136/246 |
| 2010/0101631 A1 * | 4/2010 | Battiston et al. | 136/246 |
| 2010/0302654 A1 | 12/2010 | Takashi et al. | |

FOREIGN PATENT DOCUMENTS

| | | |
|---|---|---|
| JP | H10-293205 | 4/1997 |
| JP | 2008-145509 | 6/2008 |
| JP | 2009-175597 | 8/2009 |
| WO | WO 2008070431 A1 * | 6/2008 |

OTHER PUBLICATIONS

S. H. Goods and R. M. Watson, "Thermal expansion and hydration behavior of PMMA molding materials for LIGA applications", SAND2003-8000, 2003 [retrieved from internet at http://prod.sandia.gov/techlib/access-control.cgi/2003/038000.pdf on Sep. 14, 2013].*

Definition of adjacent, MacMillan Dictionary [retrieved from internet at http://www.macmilliandictionary.com/dictionary/american/adjacent on Sep. 16, 2013].*

* cited by examiner

3a

3b

3c

3d

SURFACE STRUCTURE AND FRESNEL LENS AND TOOL FOR PRODUCTION OF A SURFACE STRUCTURE

BACKGROUND OF THE INVENTION

The invention relates to a surface structure and a Fresnel lens which has at least one such surface structure. Furthermore, the invention relates to a tool for production of a surface structure and a method for production of a surface structure or Fresnel lens. Furthermore, the invention relates to the use of a Fresnel lens.

Normal lenses with a large lens diameter and short focal distance are very thick and difficult to manufacture. In order to circumvent this problem, Fresnel lenses are therefore used in multiples. The lens surface is thereby subdivided into small prisms which are disposed adjacently in one plane. Thus an essentially flat lens is produced as can be found in everyday life in the case of overhead projectors or as divergent lens on the rear windows of cars.

In concentrating photovoltaics, Fresnel lenses are used in order to concentrate solar radiation onto small solar cells. It is not the aim thereby to produce as clean an image of the sun as possible (imaging lens system), but rather merely to concentrate as much light as possible onto the solar cell (non-imaging lens system). In many applications and concrete systems, it is also sought to achieve as homogeneous a profile of the radiation strength as possible within the focal spot.

As a result of the small size of the solar cells onto which the light is concentrated in highly-concentrating photovoltaics, great demands are made upon the precision of the Fresnel lenses. At the same time, the Fresnel lenses are subjected to the effects of ambient temperature. In many desert areas, temperatures of significantly below 0° C. in winter are not unusual, whereas in summer the midday temperatures easily exceed 40° C. As a result of the temperature-induced expansion of the materials used in the lens, the refractive index of these materials changes, on the one hand, and the lens is deformed, on the other hand. The effects of temperature hence lead to a Fresnel lens fulfilling its function as concentrator with varying effectiveness, as a function of the temperature thereof, and hence indirectly as a function of the ambient temperature, the radiation and other meteorological parameters, such as e.g. wind strength and direction.

The lens geometry is based on assumptions about the refractive index of the lens material. Because the refractive index is temperature-dependent, the Fresnel lens is hence optimised with respect to a specific temperature, e.g. the average temperature, during operation. Deviations from this temperature lead to the Fresnel lens fulfilling its purpose less well because of the refractive index change associated therewith.

Generally, the original shape used in the production process of the Fresnel lens is designed such that it corresponds to the desired lens structure in current operation. Hence, the negative effect of temperature-induced deformations on the function increases with the temperature difference between operating temperature and production temperature. The production temperature is however generally significantly below (e.g. room temperature) or above (e.g. thermoplastic deformation) the typical temperatures which occur during operation.

In addition, additional deformations occur during the production process of the Fresnel lenses, e.g. due to volume shrinkage. The produced Fresnel lenses are hence no longer a true copy of the tool and do not offer optimal functionality.

In concentrating photovoltaics, at present two material combinations are used for preference:

Fresnel lenses made of polymethylmethacrylate (PMMA), designed as solid lens plate, or Fresnel lenses made of silicone which are applied on a glass plate. A Fresnel lens made of PMMA without inner stresses expands isotropically, i.e. its size changes upon temperature changes during operation but not the proportions. This ideal case in reality seldom occurs however so that also these lenses deform as a result of inner stresses or non-homogeneous temperature distributions.

In DE 29 20 630 A1 and also in U.S. Pat. No. 3,982,822, Fresnel lenses are described which are manufactured from two materials with different coefficients of expansion. In the case of these Fresnel lenses, the thermal expansion according to the previous state of the art was taken into account in the production only from the point of view of durability (see e.g. U.S. Pat. No. 3,982,822). The thermal expansion was classified previously as unproblematic from an optical viewpoint (see DE 29 20 630 A1 and U.S. Pat. No. 3,982,822).

It has however emerged that thermal effects noticeably influence the optical properties of the Fresnel lenses. As a result of the low thermal expansion of glass, the large-area change in shape plays only a subordinate role. The significantly greater thermal coefficient of expansion of silicone leads however to the silicone structure which is significantly more elastic compared to glass being deformed. This deformation takes place on the large scale of individual Fresnel prisms or facets. For example, originally straight-shaped prism edges are thereby deformed. Analogous effects or deformations can thereby be expected in all systems in which the thermal expansion of a substrate material differs from that of a lens material.

Starting herefrom, it is the object of the present invention to eliminate the disadvantages of the state of the art and to provide a surface structure and also a Fresnel lens which can be produced in a simplified manner and nevertheless have very good optical properties.

SUMMARY OF THE INVENTION

This object is achieved by the surface structure having at least one facet formed by an active edge and an inactive edge, the active edge having at least two segments of identical or different length, with each of the at least two segments of identical or different length abutting at least one other segment of the at least two segments of identical or different lengths. The segments have an identical surface profile at least in regions and the segments are disposed such that at least one segment can be transferred into an abutting segment at least in regions by rotation about an angle of 10 angular seconds up to 1 and a displacement. The segments are disposed such that a predetermined thermal deformation is compensated for. A triangle spanned in the profile of the facet by the end points of the inactive edge and of the active edge has an interior angle of less than 100° at the common end point of the inactive edge and of the active edge. Also described is a tool for production of a surface structure, and a method for production of a surface structure or Fresnel lens and the use of a Fresnel lens. Further advantageous embodiments are described herein.

According to the invention, a surface structure having at least one facet formed by an active edge and an inactive edge is provided, the active edge having at least two segments of equal or different length. According to the invention, the segments have an identical surface profile at least in regions and the segments are disposed such that at least one segment can be transferred into an adjacent segment at least in regions by rotation about an angle of greater than 0° and less than 10° and a displacement.

The segments have an identical surface profile at least in regions since at least one portion of a segment can be transferred into at least one portion of a further segment. Hence the active edge, if it is regarded according to a vertical section through the facet, can be subdivided into segments and the segments can furthermore be subdivided into portions. These portions are not physically visible since, e.g. in the case of a straight segment, there is no physical subdivision of the length into portions.

The rotation about the provided angle can be effected both in the positive and in negative direction of rotation. The axis of rotation is thereby preferably parallel to the edges between the individual segments and/or parallel to the edge between the active and the inactive edge. Preferably, the axis of rotation coincides with one of the edges between the individual segments and/or the edge between the active edge and the inactive edge.

In the case of curved edges, e.g. in point-focusing Fresnel lenses, the axis of rotation preferably corresponds to a tangent which is applied to the edge. The axis of rotation is therefore preferably perpendicular to the plane by means of which the surface profile is determined.

The lower limit for the angle can be 0.1 angular seconds, preferably 1 angular second. Consequently, the surface structure according to the invention also comprises active edges which have for example 100 segments. Preferably, the change in angle between two segments is of the order of magnitude of 10 angular seconds up to 1° and, in the case of surface structures with more than two segments or a plurality of facets, is not the same for all adjacent segments.

The displacement is effected preferably in the plane perpendicular to the edge or the edges between the individual segments and/or the edge between the active edge and the inactive edge.

There is thereby understood by surface profiles, preferably the contour which forms a segment in cross-section perpendicularly through a facet. The profile along the surface structure, i.e. parallel to the edges between the segments and/or parallel to the edge between the active edge and the inactive edge, is hence not fixed.

There are understood here by segments, individual portions from which the active edge of the surface structure is composed. At the position at which two segments abut, an edge is generally produced which usually has, in contrast to the edge between the active edge and the inactive edge, a very obtuse angle.

This also enables for example simplified manufacture of the surface structure in which for example a tool configured like a stamp is used to shape the surface structure.

The edge of a Fresnel prism on which light is refracted is termed active edge. The optically unused edge is termed inactive edge. In the case of Fresnel prisms in which the light-directing effect is achieved with the help of total reflection at one edge (TIR Fresnel prisms), the edge at which the total reflection is effective is termed active edge, the other edge of the facet is termed inactive edge. In the case of tools for production of Fresnel lenses, the edges are respectively termed analogously to the structure shaped by it. In the case of surface structures which have no optical function and do not serve as tool for production thereof, the longer edge of the surface is termed active edge.

The surface structure can be configured such that a triangle spanned in the profile of the facet through the end points of the inactive edge and of the active edge has an interior angle of less than 100° at the common end point of the inactive edge and of the active edge.

Furthermore the surface structure can be configured such that the straight connections of the contact point of the inactive edge and of the active edge to the ends respectively of the inactive edge and the active edge include an angle of less than 100°.

The segments are preferably straight, concave or convex.

Furthermore, the segments of the surface structure can be disposed such that a predetermined thermal deformation is compensated for.

With the help of computer simulations, it can be calculated according to the finite element method (FEM) how the geometry of a Fresnel prism or a Fresnel facet and also the surface structure are changed with a temperature change as a result of thermal expansion of the materials used. It can also be determined with these simulations how the surface structure must be shaped in order that it has the desired shape after a known, specified temperature change.

Furthermore, even without taking into account temperature- or production-caused deformations, surface structures which are difficult to manufacture, such as e.g. Fresnel lenses with spherical active edges, can be replaced by a surface structure according to the invention which is substantially easier to manufacture.

The segments of the surface structure can thereby be transferred into the respectively adjacent segments with generally different angles of rotation, the segment length being able to vary. Also surface structures in which the segments can be transferred into the respectively adjacent segments with partially identical and/or periodically repeating angles of rotation are possible.

The active edge is preferably concave or convex. Furthermore, the active edge can also be essentially concave, essentially convex and also essentially flat or planar.

The height of the at least one facet in the surface structure is preferably between 50 µm and 3 mm.

The material of the surface structure preferably comprises silicone, polymethylmethacrylate, acrylic glass, organic glasses, plastic materials which are transparent for light, in particular ionomers, polyvinylbutyral, ethylene vinyl acetate, polyurethane; glass, silver, aluminium, copper, nickel, nickel alloys and/or brass or consists thereof.

Furthermore, a Fresnel lens which has at least one surface structure according to the invention is according to the invention.

Preferably, this Fresnel lens can have in addition at least one surface structure with spherical active edges.

The effect of the segmented active edges resides in the fact that the Fresnel lens is deformed by thermal expansion or contraction such that this maintains its desired shape at the average operating temperature or approaches this although the average operating temperature does not correspond to the temperature during production.

It is achieved as an advantage that the temperature at which a Fresnel lens has its best optimal function can be chosen extensively independently of the temperature at which the Fresnel lens is produced. In particular, a production temperature can be chosen which is regarded as advantageous for reasons of process management, even if this does not correspond to the average operating temperature. As a result, deviations from the temperature during operation are minimised, at which temperature this lens functions optimally and the function of the lens is significantly improved.

The composition of the active edges from individual, identical segments enables the production of individual lenses or stamping tools with current ultraprecision turning machines (diamond cutting) even for large lens diameters.

The segmented active edge shape provided according to the invention can also be used, in addition to adaptation to thermal deformations, in order to compensate for any other deformations. In the case of single-component Fresnel lenses, e.g. made of polymethylmethacrylate (PMMA), the result can be deformations of the active edges as a result of volume shrinkage during production, the effects of which can be reduced likewise by an active edge shape adapted in segments.

Furthermore, it is possible to approximate any active edge shape by an active edge shape segmented according to the invention. In particular, this enables an approximation of geometries which would otherwise only be producible with difficulty.

The Fresnel lens can furthermore have at least two surface structures which are disposed concentrically. Consequently, for example a point-focusing Fresnel lens can be obtained, which lens has both spherical or free-form active edges and also active edges segmented according to the invention.

Furthermore, the Fresnel lens can have at least two surface structures which are disposed linearly and parallel adjacently. Hence a linear line-focusing Fresnel lens can be obtained, the latter being able to have both surface structures according to the invention with a segmented active edge and also spherical or free-form active edges.

Furthermore, the Fresnel lens can be applied on a carrier, comprising or consisting of glass, polymethylmethacrylate, acrylic glass, organic glasses, plastic materials which are transparent for light, in particular ionomers, polyvinylbutyral, ethylene vinyl acetate and/or polyurethane.

The carrier for the Fresnel lens can thereby have a round, oval, square, rectangular or hexagonal shape. This can be selected correspondingly as a function of the field of use. Furthermore, the Fresnel lens can have at least two materials with different coefficients of expansion. Hence, for example a carrier made of a particularly stable material with a surface structure made of an easily shapeable material can be achieved.

Furthermore, the Fresnel lens can be a convergent lens or a divergent lens. Furthermore, it can be a point-focusing or a line-focusing Fresnel lens.

Furthermore, also arrangements of a plurality of Fresnel lenses according to the invention are possible. These can be situated preferably on a common carrier.

A tool for production of a previously described surface structure is according to the invention, the tool having a negative structure of at least one facet, of at least one active edge or of at least one segment.

This includes in particular also tools for production of Fresnel lenses according to the invention. Also tools which comprise the negative structure of the surface structure only of parts of individual Fresnel lenses or even of a plurality of complete Fresnel lenses are according to the invention.

The tools for the production of the Fresnel lenses are generally cut with diamonds (micromechanical production of an original shape for the Fresnel lenses or Fresnel lens tool). However, it is technically very complex to produce lens tools of a free-form geometry. Free-forms can in fact be produced by this method but are significantly more difficult to produce than tool shapes which can be cut portion-wise with the edge of a diamond. Original shapes manufactured in this way for Fresnel lenses generally have straight active and inactive edges since the cutting edges of the diamond which is used are generally straight. Of optical interest is above all the shaping of the active edge.

The inactive edge has no useful optical function for the lens, it is generally chosen to be as steep as possible in order to keep the optical losses low. The removal of the lens from the tool is thereby limiting. Since deformations of the inactive edge have no influence on the optical function of the Fresnel lens, the shape optimisation can also be implemented with the edge condition that the optically irrelevant inactive edges in the resulting tool shape are straight or have a different shape which is advantageous for production. However this does not remove the difficulty that the active edge must be cut as free-form geometry.

In order to simplify the tool production, it is therefore proposed to approximate the optimum active edge geometry of the tool with a plurality of straight or uniformly curved segments (see FIG. 3a). Thermal deformations, in the case of a Fresnel lens produced with such a tool, lead to the shape of the active edges approximating to a specific, desired geometry in the case of a temperature deviating from the production temperature but does not reproduce this exactly. Even in computer calculations for shape optimisation, it can be taken into account that the active edges in the resulting tool shape are intended to consist of a plurality of straight or uniformly curved segments.

A tool can thereby be cut with a shape determined by computer simulations (e.g. FEM) so that for example a Fresnel lens can be produced which has a specific desired shape at a temperature which does not correspond to the production temperature.

Furthermore, the tool can consist of curable plastic materials, fluorinated hydrocarbons, ethylene-tetrafluoroethylene (ETFE), polytetrafluoroethylene (PTFE), plastic materials which are possibly rigid, polymethylmethacrylate (PMMA), aluminium, copper, nickel, nickel alloys, brass or comprise this.

Also a method for production of a previously described surface structure or Fresnel lens is according to the invention, the thermal deformation of the surface structure being determined by a simulation calculation for specified temperature changes, the surface profile of the active edge which is sought for the temperature range occurring during use being determined and the arrangement of the segments being effected in shape such that the simulated thermal deformation is taken into account.

In this way, surface structures and also lenses can be produced both simply and economically. Furthermore, surface structures and also Fresnel lenses produced in this way have the ability to concentrate as much light as possible onto solar cells provided that they are used as concentrator lens.

The production can be effected for example by stamping, casting or injection moulding, the liquid or soft material being situated at least partially in contact with the tool and the material or the material used solidifying at least partially, the temperature during production of the surface structure or Fresnel lens (=manufacturing temperature) not corresponding to the temperature during use of the surface structure (=operating temperature).

Furthermore, the use of at least one Fresnel lens according to the invention in a concentrator-photovoltaic module is according to the invention.

The use of an individual Fresnel lens according to the invention in a concentrator-photovoltaic module is possible on the one hand. On the other hand, also arrangements of a plurality of Fresnel lenses in a concentrator-photovoltaic module are however possible. These can be situated preferably on a common carrier.

BRIEF DESCRIPTION OF THE DRAWINGS

The subject according to the application is intended to be explained with reference to the subsequent FIGS. 1 to 5 and also the examples 1 to 3 without wishing to restrict said subject to these variants.

DETAILED DESCRIPTION OF THE INVENTION

Figure 1:
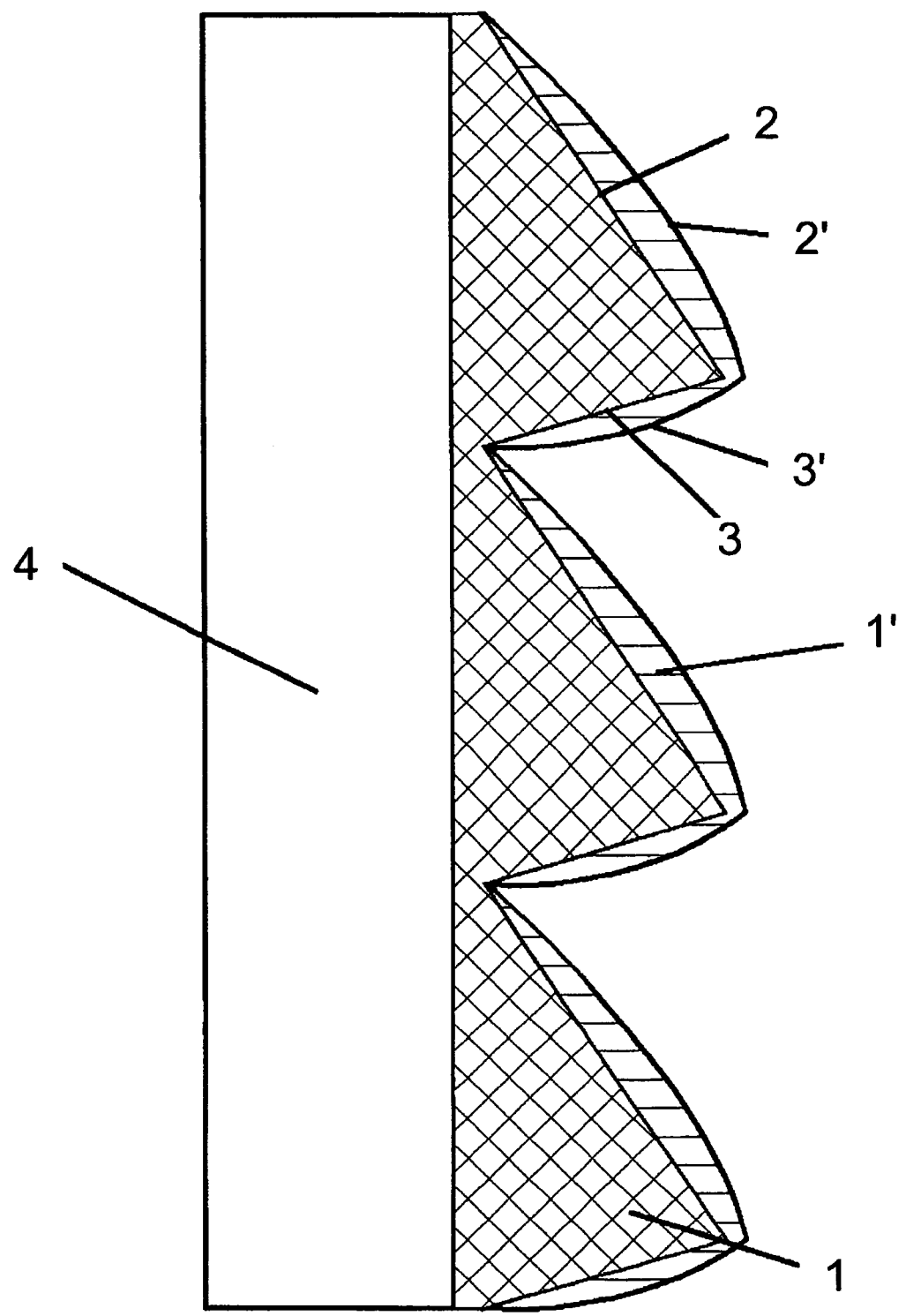
FIG. 1 shows a schematic representation of the thermal deformation of a Fresnel lens structure.

FIG. 1 shows a surface structure 1 which is disposed on a carrier 4. The schematic representation of the thermal deformation of a Fresnel lens structure as surface structure Ion a glass plate as carrier 4 during heating above the production temperature is shown here. The region which is double-hatched shows the non-deformed surface structure 1 made of elastic material with high thermal expansion (e.g. silicone). The carrier 4 is manufactured for example from a material with a low thermal expansion (e.g. glass). The active edge 2 and also the inactive edge 3 concern the surface structure 1 in the normal state. The active edge 2' and also the inactive edge 3' concern the shape of the surface structure in the deformed state 1', which is obtained as a result of an increase in temperature. The deformation is thereby represented greatly exaggerated.

Figure 2:
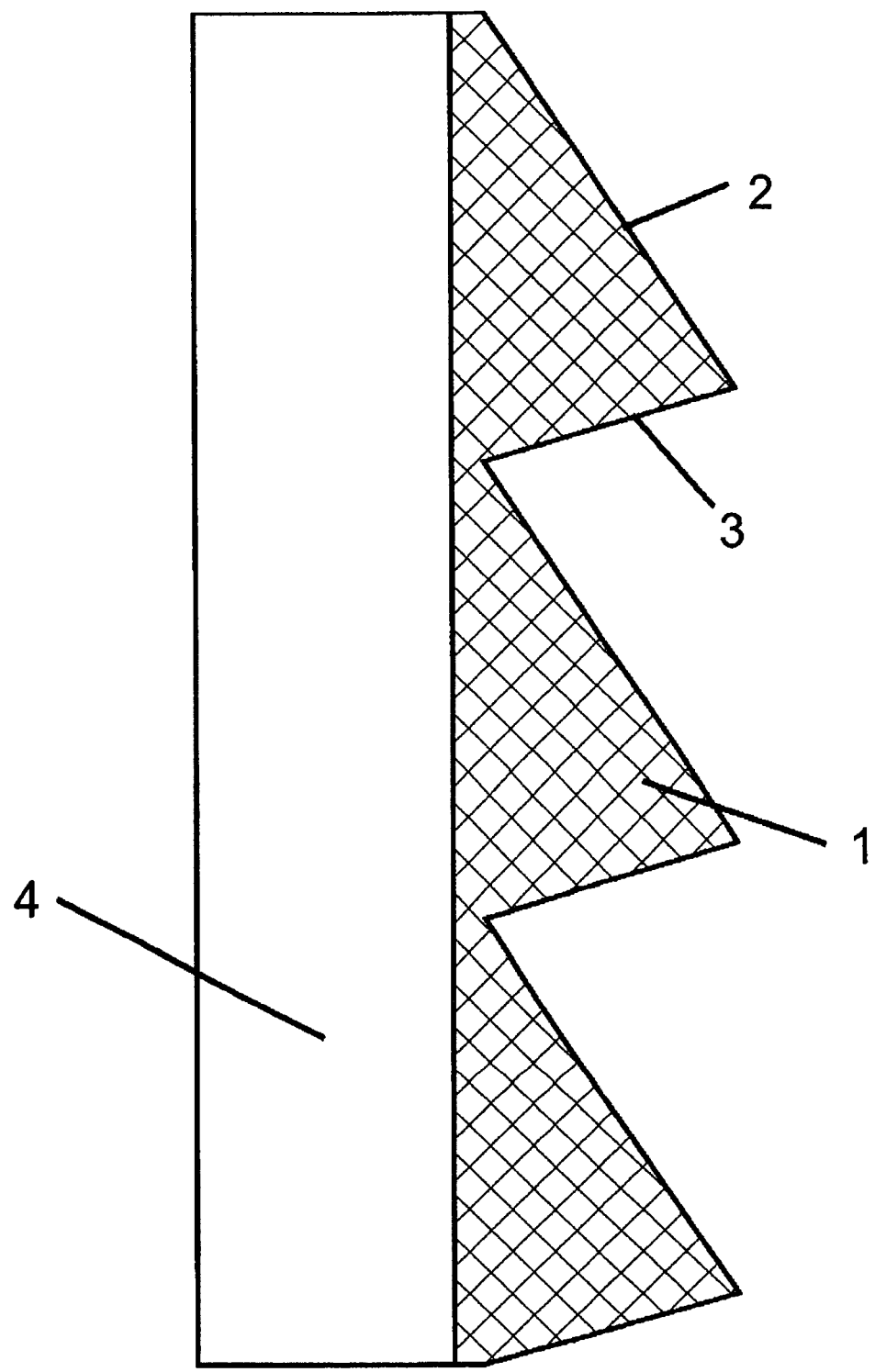
FIG. 2 shows the schematic construction of a Fresnel lens structure.

FIG. 2 shows schematically a surface structure 1 which is disposed on a carrier 4. The surface structure has active edges 2 and also inactive edges 3.

Figure 3:
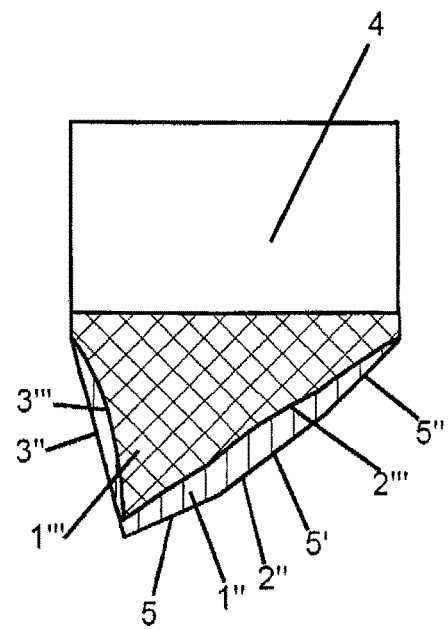
FIGS. 3a to 3d show various surface structures which are disposed on a carrier.
Figure 3:
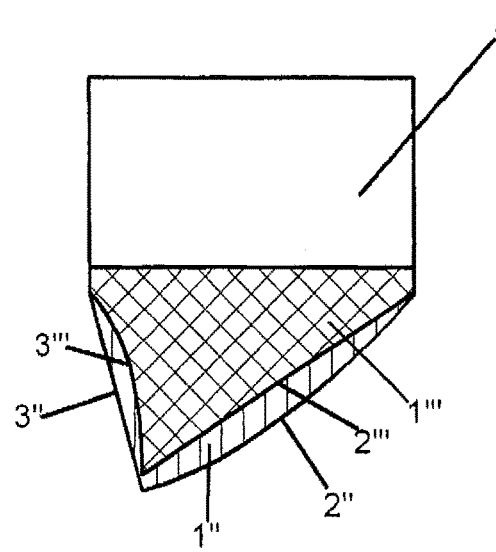
Figure 3:
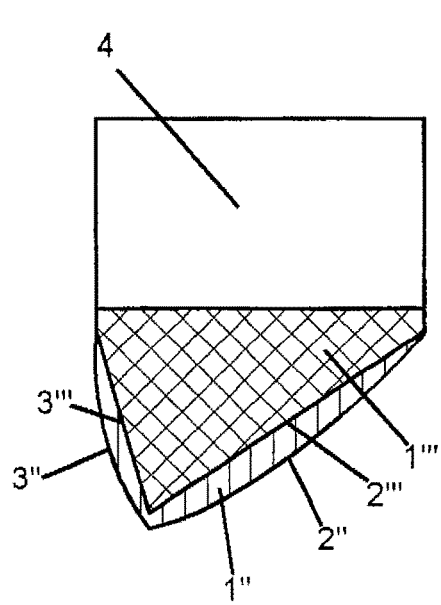
Figure 3:
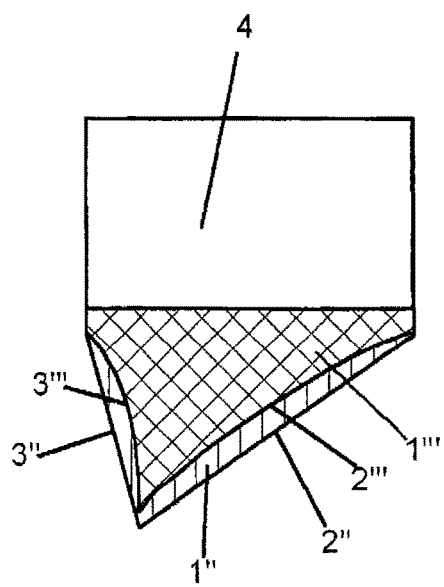

FIG. 3a shows an embodiment of the surface structure 1''' according to the invention at operating temperature on a carrier 4. The ideal shape of the active edge of the surface structure at manufacturing temperature 1'' is thereby approximated by three straight segments 5, 5', 5'' so that, during the temperature change, the active edge 2''' (at operating temperature) is produced, which is approximately flat. Since in this geometry exclusively straight segments 5, 5', 5'' occur, such a segmented active edge 2'' (at manufacturing temperature) is significantly easier to produce than active edge shapes known from prior art. The inactive edge 3'' was manufactured straight. At operating temperature, the inactive edge has a concave shape 3'''.

FIG. 3b shows a surface structure 1''' at operating temperature, which is disposed on a carrier 4. At manufacturing temperature, the surface structure 1'' has a convex active edge 2''. At operating temperature, the active edge 2''' has a straight shape. The inactive edge 3'' was manufactured straight. At operating temperature, the inactive edge 3''' has a convex shape. By means of such a construction, the thermal deformation of the active edge would be compensated for exactly. It corresponds only to the state of the art with respect to the fact that curved active edges are already described and, in the case of Fresnel lenses with large-scale facets, are used also for optical reasons. In the case of small-scale facets, such a shape can however only be produced with great difficulty (if at all) with good quality.

In FIG. 3c, a surface structure 1'' (at manufacturing temperature) with a convex active edge 2'' and also a convex inactive edge 3'' at manufacturing temperature is represented. At operating temperature, the active edge 2''' and also the inactive edge 3''' of the surface structure 1''' have a straight shape. The surface structure 1'' or 1'' is disposed here on a carrier 4. Reference is made to the fact that such shapes, in contrast to the segmented shapes according to the invention, as are produced in FIG. 3a, are far more complex to produce.

FIG. 3d shows a surface structure 1'' or 1''' on a carrier 4, as is known from the prior art. Both the active edge 2'' and the inactive edge 3''' have a straight shape at manufacturing temperature. At operating temperature, both the active edge 2''' and the inactive edge 3''' are concave.

Figure 4:
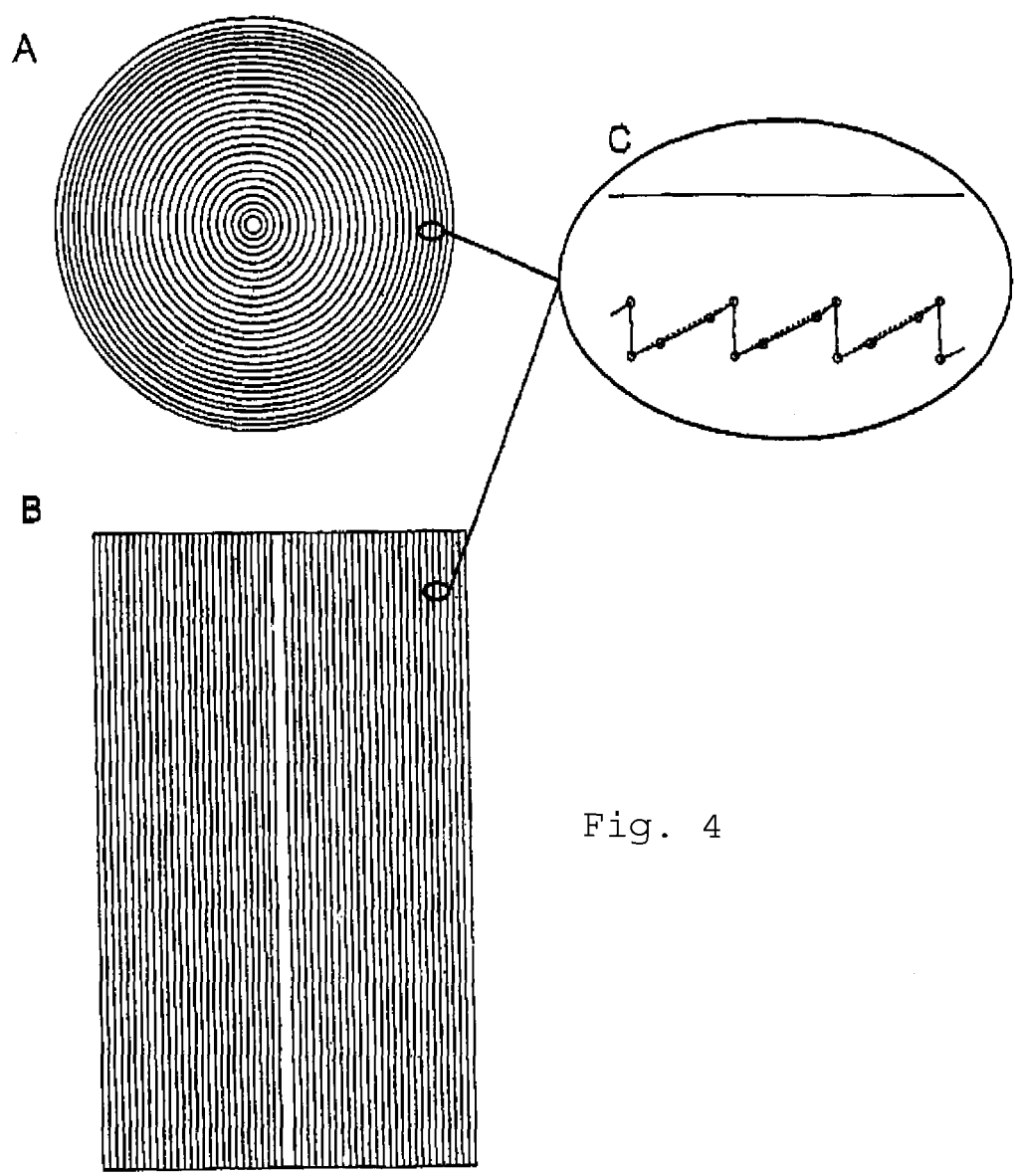
FIG. 4a shows a point-focusing lens.
FIG. 4b shows a line-focusing lens.
FIG. 4c shows a surface structure with segmented active edges.

FIG. 4a shows a circular, point-focusing lens which has active edges segmented according to the invention.

In FIG. 4b, a rectangular, line-focusing lens with active edges segmented according to the invention is represented.

FIG. 4c shows a surface structure, as can be used for the point-focusing lens and also the line-focusing lens. In this embodiment, the active edges are constructed from three segments which are of a different length. The inactive edge has a straight shape.

Figure 5:
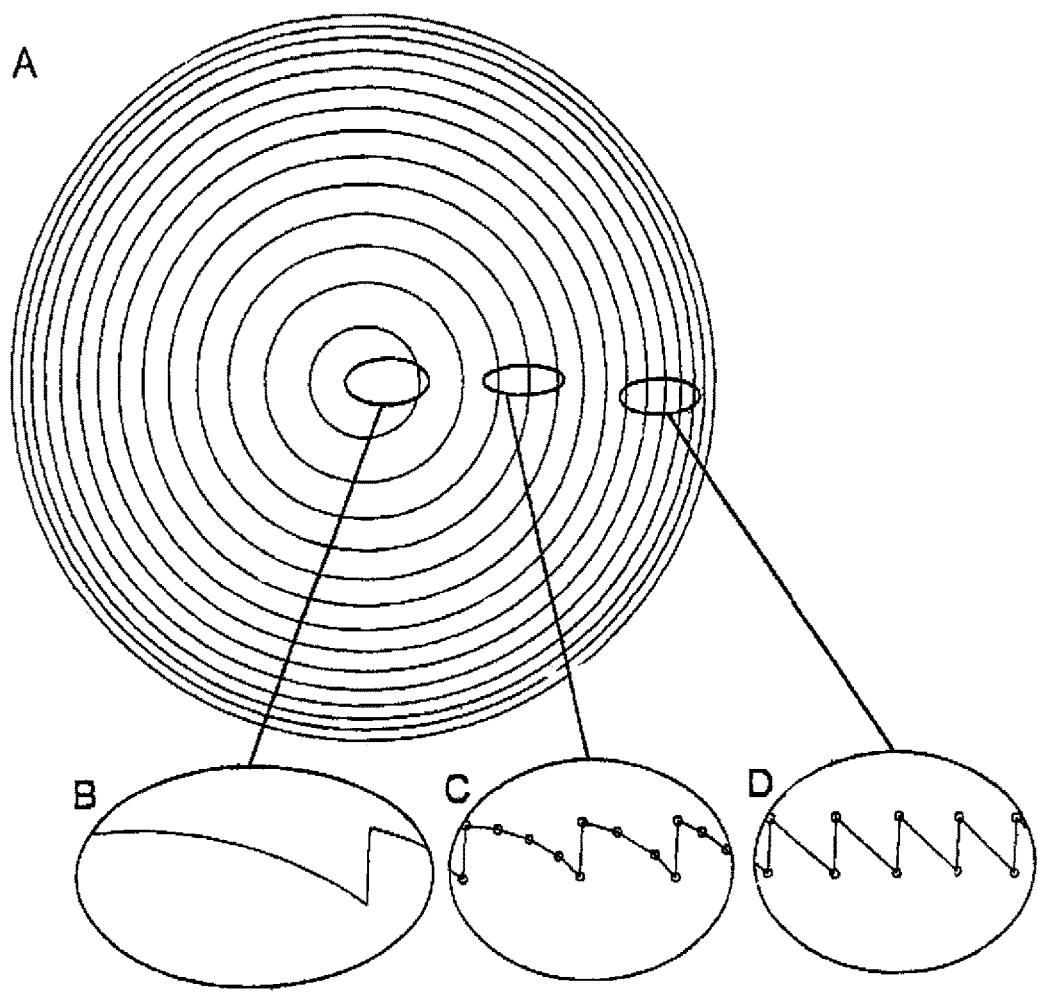
FIG. 5a shows a point-focusing lens.
FIG. 5b shows aspherically cut active edges.
FIG. 5c shows active edges segmented according to the invention.
FIG. 5d shows straight active edges.

FIG. 5a shows a circular, point-focusing lens which has surface structures constructed differently according to FIG. 5b, 5c or 5d.

In FIG. 5b, a surface shape of the surface structure is represented, as is present in the centre of the point-focusing lens according to FIG. 5a. The inactive edge hereby has a straight shape. The active edge is cut aspherically here.

FIG. 5c shows a surface structure according to the invention. The segmented active edges thereby have an outwardly decreasing number of segments. The inactive edge is straight. This surface structure is present in the point-focusing lens in the region between centre (FIG. 5b) and outer region (FIG. 5d).

FIG. 5d shows a surface structure which has both straight active edges and straight inactive edges. This surface shape is used in the outer region of the point-focusing lens according to FIG. 5a.

Example 1

Point-focusing Fresnel lens with concentric Fresnel prisms in which all of the active edges have a structure comprising three segments similar to that in FIG. 3a. The exact shape of the individual active edges is optimised for each Fresnel prism and hence for each active edge individually. Each of the three segments of an active edge therefore has a separate angle and the length of the individual segments is likewise not constant, i.e. the three segments of an active edge are generally not of equal length (FIG. 4a).

Example 2

Linear, line-focusing Fresnel lens with linear Fresnel prisms, the active edges of which consist respectively of three segments which resemble those of FIG. 3a. The exact shape of the individual active edges is optimised individually for each Fresnel prism. Each segment therefore has a separate angle and a separate length (FIG. 4b).

Example 3

Point-focusing Fresnel lens with concentric Fresnel prisms in which the central prisms or facets have aspherical or spherical active edges and segmented active edges abut further outwards. The number of segments per active edge thereby reduces with increasing spacing of the Fresnel prisms from the optical axis. In the outer region of the lens, the Fresnel prisms have only one straight active edge. The exact arrangement and also the angle of the individual segments of an active edge are optimised individually for each Fresnel prism in order to approximate as best as possible in total to the desired active edge shape at operating temperature.

The invention claimed is:

1. A Fresnel lens having:
   at least one surface structure, wherein the material of the at least one surface structure consists of silicone, polymethylmethacrylate, acrylic glass, an organic glass, a plastic material which is transparent for light, glass, silver, aluminium, copper, nickel, nickel alloys or brass,
   each surface structure having at least one facet formed by an active edge and an inactive edge, wherein the height of the at least one facet is between 50 µm and 3 mm,
   wherein the Fresnel lens is applied on a carrier, which is comprised of glass, polymethylmethacrylate, acrylic glass, organic glasses, and/or plastic materials which are transparent for light,
   wherein the coefficient of expansion of the material of the carrier is different from the coefficient of expansion of the material of the at least one surface structure,
   wherein the Fresnel lens has a production temperature and an average operating temperature, the average operating temperature being lower than the production temperature,
   wherein, at the production temperature of the Fresnel lens, each active edge has at least two segments of identical or different length, wherein one of the at least two segments of identical of different length abuts at least one other segment of the at least two segments of identical or different length,
   the segments of each facet having an identical surface profile at least in regions and the segments being disposed such that at least one segment can be transferred into an abutting segment at least in regions by rotation about an angle of 10 angular seconds up to 1° and a displacement, wherein a triangle spanned in the profile of the facet by the end points of the inactive edge and of the active edge has an interior angle of less than 100° at the common end point of the inactive edge and of the active edge,
   wherein the segments are disposed such that a predetermined thermal deformation caused by a temperature change from the production temperature of the Fresnel lens to the average operating temperature of the Fresnel lens is compensated for, such that, at a temperature change from the production temperature of the Fresnel lens to the average operating temperature of the Fresnel lens, the at least one surface structure is deformed by thermal contraction and has a desired shape after this temperature change, wherein it is calculated with the help of a computer simulation according to the finite element method how a geometry of the Fresnel lens and the at least one surface structure are changed with the temperature change as a result of thermal expansion of the material of the at least one surface structure and it is also determined with said computer simulation how the at least one surface structure must be shaped in order that it has a desired shape after the temperature change, and wherein a simulation calculation determines the thermal deformation of each surface structure for the temperature change, the surface profile of the active edge which is sought for the temperature range occurring during use being determined and the arrangement of the segments being effected in shape such that the simulated thermal deformation is taken into account.

2. The Fresnel lens according to claim 1, wherein, with respect to each facet the straight connections of the contact point of the inactive edge and of the active edge to the ends respectively of the inactive edge and the active edge including an angle of less than 100°.

3. The Fresnel lens according to claim 1, wherein each of the segments are straight, concave or convex.

4. The Fresnel lens according to claim 1, wherein each active edge is concave or convex.

5. The Fresnel lens according to claim 1, wherein the Fresnel lens has at least one additional surface structure with spherical active edges.

6. The Fresnel lens according to 1, wherein the Fresnel lens has at least two surface structures which are disposed concentrically.

7. The Fresnel lens according to claim 1, wherein the Fresnel lens has at least two surface structures which are disposed linearly and parallel adjacently.

8. The Fresnel lens according to claim 1, wherein the carrier has a round, oval, square, rectangular or hexagonal shape.

9. The Fresnel lens according to claim 1, wherein the Fresnel lens is a convergent lens or a divergent lens.

10. The Fresnel lens according to claim 1, wherein the Fresnel lens is a point-focusing or a line-focusing Fresnel lens.

11. The Fresnel lens according to claim 1, wherein the carrier is comprised of ionomers, polyvinylbutyral, ethylene vinyl acetate and/or polyurethane.

12. The Fresnel lens according to claim 1, wherein the carrier is a glass plate carrier, wherein the material of the at least one surface structure consists of silicone.

13. A concentrator-photovoltaic module comprising at least one Fresnel lens according to claim 1.

* * * * *